(12) United States Patent
Kumakura et al.

(10) Patent No.: US 9,941,124 B1
(45) Date of Patent: Apr. 10, 2018

(54) SEMICONDUCTOR DEVICE

(71) Applicant: Sanken Electric Co., Ltd., Niiza-shi, Saitama (JP)

(72) Inventors: Hiromichi Kumakura, Niiza (JP); Tomonori Hotate, Niiza (JP); Hiroko Kawaguchi, Niiza (JP); Hiroshi Shikauchi, Niiza (JP); Ryohei Baba, Niiza (JP); Yuki Tanaka, Niiza (JP)

(73) Assignee: SANKEN ELECTRIC CO., LTD., Saitama (JP)

( * ) Notice: Subject to any disclaimer, the term of this patent is extended or adjusted under 35 U.S.C. 154(b) by 0 days.

(21) Appl. No.: 15/498,364

(22) Filed: Apr. 26, 2017

(30) Foreign Application Priority Data

Mar. 6, 2017 (JP) ................................ 2017-041258

(51) Int. Cl.
| | | |
|---|---|---|
| *H01L 29/06* | (2006.01) | |
| *H01L 21/04* | (2006.01) | |
| *H01L 29/872* | (2006.01) | |
| *H01L 23/31* | (2006.01) | |
| *H01L 29/16* | (2006.01) | |
| *H01L 21/02* | (2006.01) | |

(52) U.S. Cl.
CPC .... *H01L 21/0495* (2013.01); *H01L 21/02063* (2013.01); *H01L 21/02236* (2013.01); *H01L 21/02334* (2013.01); *H01L 21/045* (2013.01); *H01L 23/3171* (2013.01); *H01L 29/0619* (2013.01); *H01L 29/1608* (2013.01); *H01L 29/872* (2013.01)

(58) Field of Classification Search
CPC .......................... H01L 29/0619; H01L 29/872
USPC ................................................. 257/484, 486
See application file for complete search history.

(56) References Cited

U.S. PATENT DOCUMENTS

| | | | | |
|---|---|---|---|---|
| 4,628,338 | A | * | 12/1986 | Nakayama ............ H01L 23/485 257/271 |
| 9,391,136 | B1 | * | 7/2016 | Kawaguchi ......... H01L 29/0619 |
| 2016/0093748 | A1 | | 3/2016 | Mieczkowski et al. |

* cited by examiner

*Primary Examiner* — Mark Prenty
(74) *Attorney, Agent, or Firm* — Procopio, Cory, Hargreaves & Savitch LLP

(57) ABSTRACT

A semiconductor device includes a semiconductor base body having a first main surface and a second main surface, the first main surface and the second main surface being opposite with each other; a Schottky electrode that is disposed on the first main surface and forms a Schottky junction with the semiconductor base body; and a barrier metal layer that is brought into ohmic contact with the first main surface around the Schottky electrode and covers a side surface of the Schottky electrode.

2 Claims, 4 Drawing Sheets

SEMICONDUCTOR DEVICE

CROSS REFERENCE TO RELATED APPLICATIONS AND INCORPORATION BY REFERENCE

This application is based upon and claims the benefit of priority from prior Japanese Patent Application P2017-041258 filed on Mar. 6, 2017; the entire contents of which are incorporated by reference herein.

BACKGROUND OF THE INVENTION

1. Field of the Invention

The present invention relates to a semiconductor device having a Schottky junction.

2. Description of the Related Art

A variety of countermeasures are being studied for protecting a semiconductor device from entry of moisture. For example, a protective film in which a silicon oxide film, a silicon nitride film, and an organic insulating film are laminated onto one another is used for protecting an electrode (hereinafter referred to as a "Schottky electrode") that forms a Schottky junction with a semiconductor substrate. This protective film is disposed over an upper surface of the Schottky electrode while maintaining such a laminated structure as described above, whereby the entry of moisture into the Schottky junction is suppressed.

However, even if the protective film is formed, moisture may enter the Schottky junction in some cases. For example, it is conceivable that moisture enters a space between a thermal oxide film formed on a surface of the semiconductor substrate and an insulating film (hereinafter referred to as a "CVD insulating film") formed on the thermal oxide film by a chemical vapor deposition method (CVD method). This moisture contaminates the interface between the Schottky electrode disposed on the surface of the semiconductor substrate and the semiconductor substrate. Moreover, the Schottky electrode itself may be corroded in some cases. In this way, reliability and characteristics of the semiconductor device are decreased.

SUMMARY OF THE INVENTION

An aspect of the present invention inheres in a semiconductor device. The semiconductor device includes a semiconductor base body having a first main surface and a second main surface, the first main surface and the second main surface being opposite with each other; a Schottky electrode that is disposed on the first main surface and forms a Schottky junction with the semiconductor base body; and a barrier metal layer that is brought into ohmic contact with the first main surface around the Schottky electrode and covers a side surface of the Schottky electrode.

DETAILED DESCRIPTION OF THE INVENTION

Figure 1:
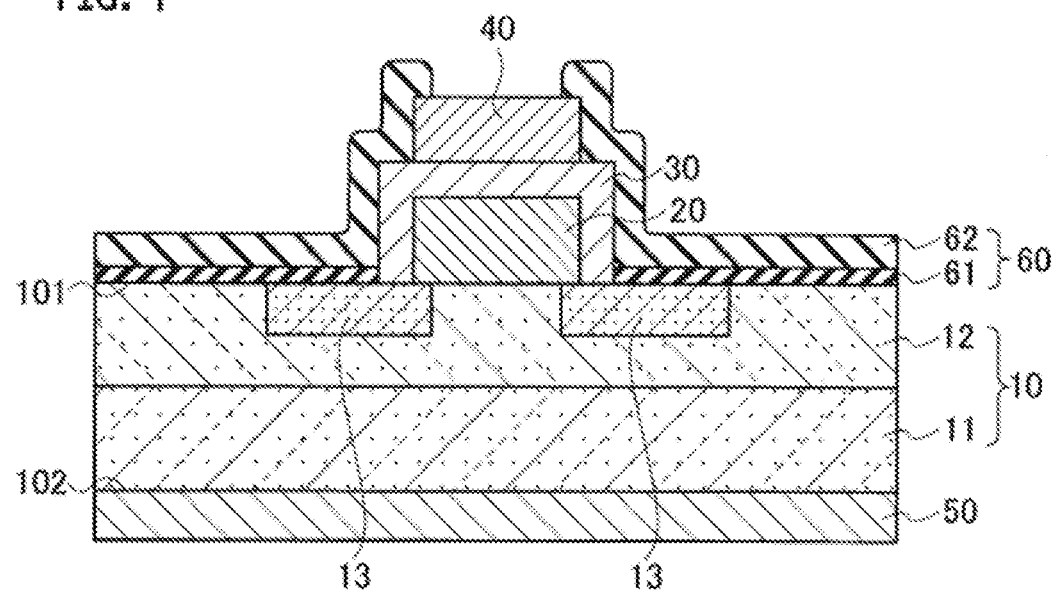
FIG. 1 is a schematic cross-sectional view showing a configuration of a semiconductor device according to a first embodiment of the present invention.

Various embodiments of the present invention will be described with reference to the accompanying drawings. It is to be noted that the same or similar reference numerals are applied to the same or similar parts and elements throughout the drawings, and the description of the same or similar parts and elements will be omitted or simplified.

In the following descriptions, numerous specific details are set forth, such as specific signal values, to provide a thorough understanding of the present invention. However, it will be obvious to those skilled in the art that the present invention may be practiced without such specific details.

First Embodiments

As shown in FIG. 1, a semiconductor device according to a first embodiment of the present invention includes: a semiconductor base body 10 having a first main surface 101 and a second main surface 102 which are opposite with each other; a Schottky electrode 20, which is disposed on the first main surface 101 and forms a Schottky junction with the semiconductor base body 10; and a barrier metal layer 30, which is in ohmic contact with the first main surface 101 around the Schottky electrode 20, and covers a side surface of the Schottky electrode 20.

In the semiconductor device shown in FIG. 1, the barrier metal layer 30 is continuously disposed from the side surface of the Schottky electrode 20 to an upper surface thereof. Then, a first main electrode 40 is disposed on an upper surface of the barrier metal layer 30.

A second main electrode 50 brought into ohmic contact with the semiconductor base body 10 is disposed on the second main surface 102 of the semiconductor base body 10. The semiconductor device shown in FIG. 1 is a Schottky barrier diode (SBD) in which a main current flows in a film thickness direction of the semiconductor base body 10 between the first main electrode 40 and the second main electrode 50. When the semiconductor base body 10 is an N-type semiconductor, then the first main electrode 40 functions as an anode electrode, and the second main electrode 50 functions as a cathode electrode.

The barrier metal layer 30 is made of a material that suppresses diffusion of metal contained in the Schottky electrode 20 and metal contained in the first main electrode 40. That is, the barrier metal layer 30 suppresses the metal contained in the Schottky electrode 20 from being diffused into the first main electrode 40, and the barrier metal layer 30 suppresses the metal contained in the first main electrode 40 from being diffused into the Schottky electrode 20. Ti, Mo, Ni, or the like is used for the material of the Schottky electrode 20. Al, Cu, Al/Ni, Cu/Ni, or the like is used for the material of the first main electrode 40. TiN, Ta, TaN, W, or the like is preferably used for the material of the barrier metal layer 30. For example, the barrier metal layer 30 suppresses Al atoms from being diffused from the first main electrode 40, which is made of an Al material, to the Schottky electrode 20.

An insulating protective film 60 is disposed on the first main surface 101 of the semiconductor base body 10. The Schottky electrode 20 and the barrier metal layer 30 are disposed on the first main surface 101 at an opening that penetrates the protective film 60 from an upper surface thereof to a lower surface thereof. The protective film 60 shown in FIG. 1 has a structure in which a CVD insulating film 62 is laminated on a thermal oxide film 61 disposed on the first main surface 101.

The thermal oxide film 61 is formed on the first main surface 101, whereby a flat and clean surface with a small defect level is obtained. In this way, a fixed charge on the surface of the semiconductor base body 10 can be reduced. Then, a CVD insulating film 62, which is formed thick with ease, is formed on the thermal oxide film 61. In this way, the protective film 60 can be formed to a predetermined thickness. The CVD insulating film 62 is disposed, whereby entry of moisture into the semiconductor device can be prevented and mechanical protection for the semiconductor device can be enhanced.

As shown in FIG. 1, the barrier metal layer 30 is disposed between the Schottky electrode 20 and the protective film 60. That is, on a side surface of the protective film 60, which faces the Schottky electrode 20, an interface between the thermal oxide film 61 and the CVD insulating film 62 is in contact with the barrier metal layer 30. In addition, around the Schottky electrode 20, a lower surface of the barrier metal layer 30 is in contact with the first main surface 101 of the semiconductor base body 10. Therefore, even when moisture passes through the interface between the thermal oxide film 61 and the CVD insulating film 62, the barrier metal layer 30 prevents this moisture from entering the Schottky junction.

The semiconductor base body 10 has a structure in which a low-concentration N-type semiconductor layer 12 is laminated on a high-concentration N-type semiconductor substrate 11. For example, the semiconductor substrate 11 is a silicon carbide substrate (SiC substrate), and the semiconductor layer 12 is an epitaxial growth layer.

Moreover, the semiconductor base body 10 includes a guard ring 13 that is disposed on a part of an upper portion of the semiconductor base body 10 so as to surround a periphery of a region (hereinafter referred to as a "contact surface") of the first main surface 101, on which the Schottky electrode 20 is disposed. The guard ring 13 forms a pn junction with a surrounding region of the semiconductor base body 10. When the semiconductor layer 12 is of the N type, the guard ring 13 is of the P type.

By the guard ring 13, electric field concentration at an end portion of the contact surface is alleviated. In this way, breakage of the semiconductor device, which is caused by the electric field concentration, can be prevented. The depth and width of the guard ring 13 are appropriately set in response to the structure of the semiconductor device, the withstand voltage required thereof, and the like. Note that a field limiting ring (FLR) may be formed on an outside of the guard ring 13 in order to suppress a decrease in the withstand voltage of the semiconductor device.

Such formation of the protective film 60 on the first main surface 101 of the semiconductor base body 10 suppresses moisture from entering the Schottky junction; however, this is not sufficient. For example, moisture enters the interface between the thermal oxide film 61 and the CVD insulating film 62.

In contrast, in the semiconductor device shown in FIG. 1, the Schottky electrode 20 is not in contact with the interface between the thermal oxide film 61 and the CVD insulating film 62. The barrier metal layer 30 prevents moisture, which enters the inside of the semiconductor device, from reaching the Schottky junction and the Schottky electrode 20, which includes moisture that goes along the interface between the thermal oxide film 61 and the CVD insulating film 62, and enters the inside of the semiconductor device.

As described above, in the semiconductor device according to the first embodiment of the present invention, the Schottky junction and the Schottky electrode 20 are protected by the barrier metal layer 30. That is, the interface between the Schottky electrode 20 and the semiconductor base body 10 is suppressed from being contaminated by the moisture that has entered the inside of the semiconductor substrate, and the Schottky electrode 20 itself is suppressed from being corroded. Hence, in accordance with the semiconductor device shown in FIG. 1, reliability and characteristics thereof can be suppressed from being decreased.

Note that, as shown in FIG. 1, it is preferable that an outer edge of the Schottky electrode 20 overlap a part of an inner side of the guard ring 13. The Schottky electrode 20 and the guard ring 13 are overlapped with each other, whereby exposure of the contact surface can be completely prevented. Therefore, in the manufacturing process of the semiconductor device, the Schottky electrode 20 serves as a mask after the Schottky electrode 20 is formed, and the contact surface can be prevented from being etched, and so on.

Figure 2:
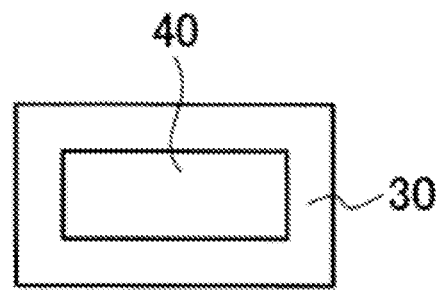
FIG. 2 is a schematic plan view showing the configuration of the semiconductor device according to the first embodiment of the present invention.

As shown in FIG. 2, it is preferable that the first main electrode 40 be disposed in the inside of the barrier metal layer 30 when viewed from above. That is, an area of the first main electrode 40 is smaller than an area of the barrier metal layer 30. This makes it easy to manufacture the semiconductor device. For example, a margin in positional alignment between the barrier metal layer 30 and the first main electrode 40 can be increased.

When a ratio of the area of the first main electrode 40 to the area of the barrier metal layer 30 when viewed from above is large, then adhesiveness between the barrier metal layer 30 and the first main electrode 40 is high. However, the mechanical strength of the semiconductor device when stress is applied thereto is decreased. Meanwhile, when the ratio of the area of the first main electrode 40 to the area of the barrier metal layer 30 is small, the adhesiveness between the barrier metal layer 30 and the first main electrode 40 is decreased though the mechanical strength against the stress is large. Moreover, when the ratio of the area of the first main electrode 40 to the area of the barrier metal layer 30 is too small, malfunctions occur that the first main electrode 40 is peeled off, that electric resistance of the first main electrode 40 is increased to generate heat, and the like.

As a result of repeated studies by the inventors of the present invention, it was found that the ratio of the area of the first main electrode 40 to the area of the barrier metal layer 30 is preferably 0.6 or more to less than 1.

Hereinafter, a description will be made of a method for manufacturing the semiconductor device according to the embodiments of the present invention with reference to the drawings. Note that the method for manufacturing the semiconductor device, which will be described below, is merely an example, and it is a matter of course that such a manufacturing method according to the present invention is realized by other various manufacturing methods including modification examples thereof.

Figure 3:
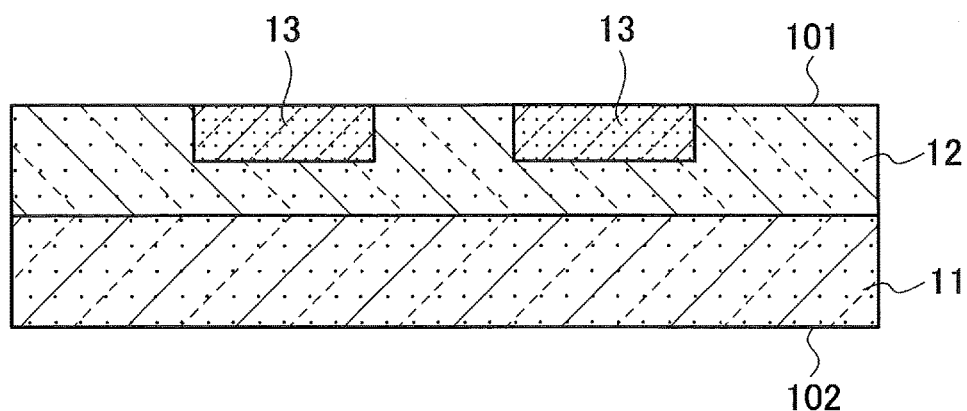
FIG. 3 to FIG. 6 are schematic process cross-sectional views for explaining a method for manufacturing the semiconductor device according to the first embodiment of the present invention.

First, the semiconductor base body 10 is prepared. For example, as shown in FIG. 3, the N-type semiconductor layer 12 is formed on the semiconductor substrate 11, whereby the semiconductor base body 10 is composed. The thickness of the semiconductor layer 12 is set in response to the withstand voltage required for the semiconductor device and the like. For example, the semiconductor substrate 11 is an N-type substrate that has substrate specific resistance of approximately 0.02 Ω·cm. The semiconductor layer 12 is a semiconductor layer, which is epitaxially grown on the semiconductor substrate 11, a film thickness of 5 to 10 μm, and an impurity concentration of approximately $5.0 \times 10^{15}$ to $15.0 \times 10^{15}$ atoms/cm$^3$.

Subsequently, the P-type guard ring 13 is formed around the contact surface. Note that though not shown, the FLR may be formed on the outside of the guard ring 13 in order to enhance the withstand voltage. For example, the guard ring 13 and the FLR are formed by ion implantation of P-type impurities such as boron (B), and aluminum (Al), and activation annealing.

Figure 4:
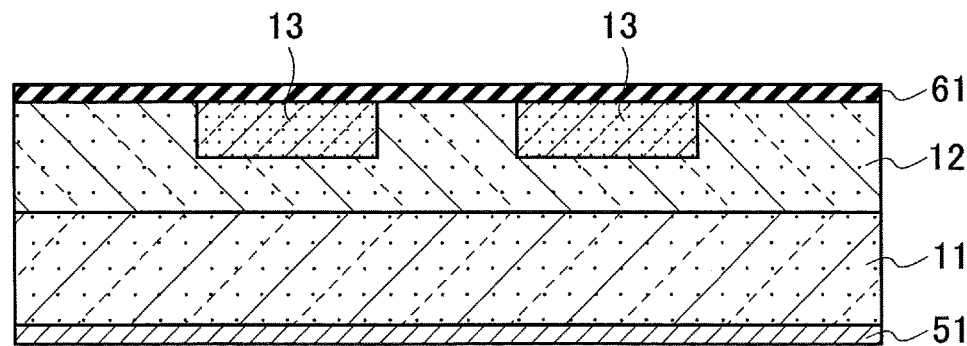

Thereafter, the first main surface 101 and second main surface 102 of the semiconductor base body 10 are thermally oxidized, whereby the thermal oxide film 61 is formed. Moreover, the thermal oxide film 61 on the second main surface 102 is removed by etching, and thereafter, as shown in FIG. 4, the contact layer 51 in ohmic contact with the semiconductor base body 10 is formed on the second main surface 102. For the contact layer 51, for example, a palladium (Pd) film or a Pd silicide film is used.

Subsequently, a part of the thermal oxide film 61 formed on the first main surface 101 is selectively removed, whereby the contact surface is exposed. The exposed contact surface is washed by pretreatment using chemicals such as ammonium peroxide water or diluted hydrofluoric acid water, for example.

Figure 5:
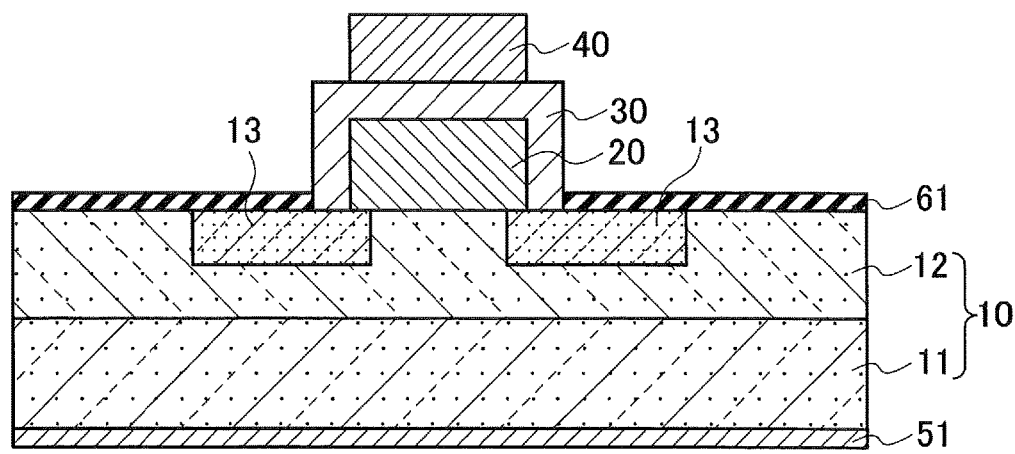

Then, as shown in FIG. 5, the Schottky electrode 20 is formed on the contact surface. The thickness of the Schottky electrode 20 is approximately 50 nm to 200 nm, for example. Thereafter, the barrier metal layer 30 is formed so as to cover the side surface and upper surface of the Schottky electrode 20. For example, the barrier metal layer 30 having a thickness of approximately 30 nm to 300 nm is formed by a vapor deposition method. Moreover, the first main electrode 40 is formed on the barrier metal layer 30.

Subsequently, the CVD insulating film 62 having a film thickness of approximately 100 nm to 2 μm is formed on the thermal oxide film 61 so as to cover the Schottky electrode 20, the barrier metal layer 30, and the first main electrode 40. The CVD insulating film 62 is, for example, a silicon oxide film, a silicon nitride film, an NSG film, a PSG film or the like.

Figure 6:
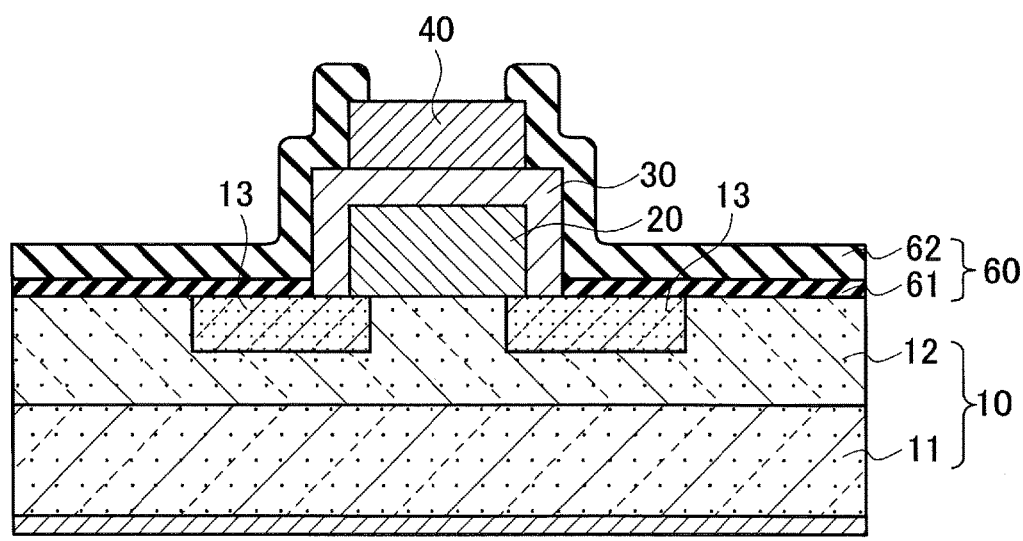

Thereafter, as shown in FIG. 6, a part of the CVD insulating film 62 is selectively removed so that the upper surface of the first main electrode 40 can be exposed. Then, a metal film for mounting is disposed on the contact layer 51, whereby the second main electrode 50 is formed. The metal film for mounting has, for example, a structure in which a metal film for enhancing adhesion to the contact layer 51, a metal film for solder bonding at the time of mounting such as wire bonding and the like are laminated onto one another.

The semiconductor device shown in FIG. 1 is completed in such a manner as described above. In accordance with the method for manufacturing a semiconductor device which is described above, the barrier metal layer 30 is formed around the Schottky electrode 20. Since the barrier metal layer 30 is in contact with the semiconductor base body 10, for example, the moisture, which has entered the interface between the thermal oxide film 61 and the CVD insulating film 62, is suppressed from reaching the Schottky junction or the Schottky electrode 20.

Second Embodiment

Figure 7:
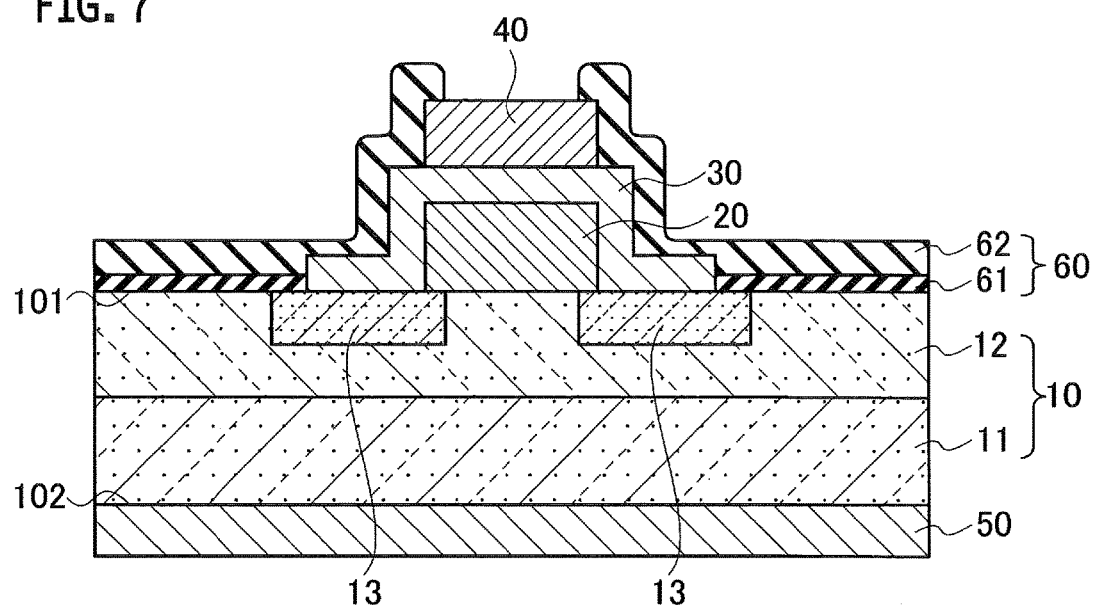
FIG. 7 is a schematic cross-sectional view showing a configuration of a semiconductor device according to a second embodiment of the present invention.

In a semiconductor device according to a second embodiment of the present invention, as shown in FIG. 7, the barrier metal layer 30 is extended on the first main surface 101 to the outside of the opening provided in the protective film 60. That is, the semiconductor device shown in FIG. 7 is different from the semiconductor device shown in FIG. 1 in that the barrier metal layer 30 is continuously disposed along the first main surface 101 of the semiconductor base body 10 from the region in contact with the side surface of the Schottky electrode 20 toward the outside. Other configurations are the same as those of the first embodiment shown in FIG. 1.

In accordance with the semiconductor device shown in FIG. 7, the moisture that has entered from the outside can be suppressed more effectively from reaching the Schottky junction.

Note that, preferably, an outer edge of the barrier metal layer 30 does not go beyond an outer edge of the guard ring 13. This is because, when the barrier metal layer 30 is disposed outside the guard ring 13, then such an outer peripheral withstand voltage structure of the semiconductor device is adversely affected. That is, when the barrier metal layer 30 is disposed in an outer peripheral region of the semiconductor device, then an electric field concentrates on the outer edge portion of the barrier metal layer 30 to decrease the withstand voltage even if the FLR is formed in the outer peripheral region.

Therefore, as shown in FIG. 7, it is preferable that the barrier metal layer 30 be extended to the outside of the outer edge of the opening and should not go beyond the outer edge of the guard ring 13. Others are substantially the same as in the first embodiment, and a duplicate description is omitted.

Other Embodiments

Figure 8:
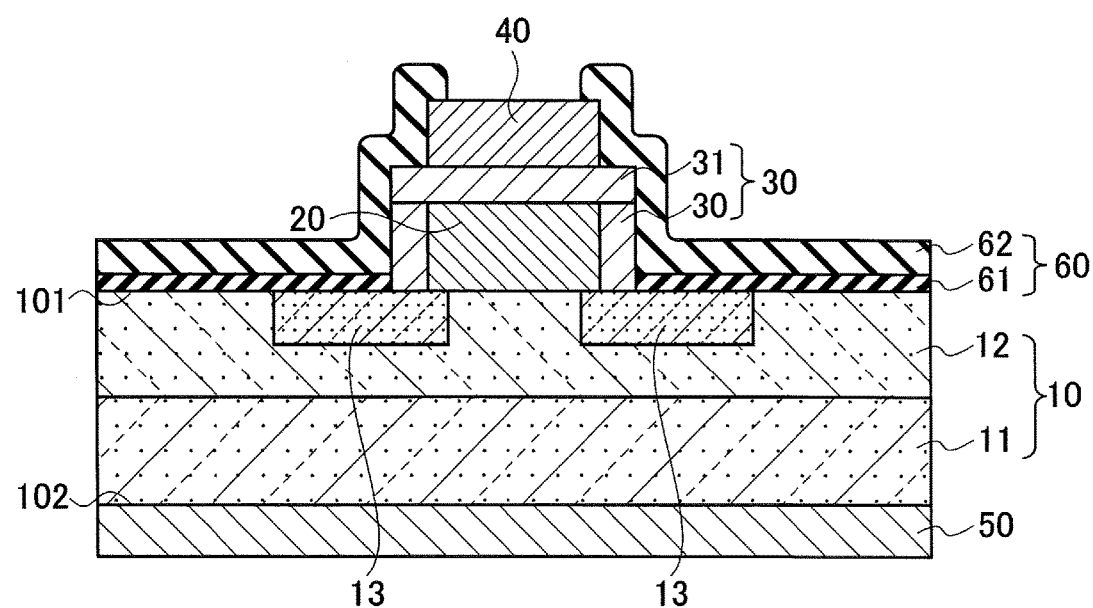
FIG. 8 is a schematic cross-sectional view showing a configuration of a semiconductor device according to another embodiment of the present invention.

In the already-made description of the embodiments, such examples are shown, where the barrier metal layer 30 is continuously disposed from the side surface of the Schottky electrode 20 to the upper surface thereof. However, if the barrier metal layer 30 is disposed on the side surface of the Schottky electrode 20, then such an effect of suppressing moisture from entering the Schottky junction is obtained even if the barrier metal layer 30 is not disposed on the upper surface of the Schottky electrode 20. Moreover, as shown in FIG. 8, the barrier metal layer 30 may be composed of two types of metal films different in material, which are: a metal film 31 disposed on the upper surface of the Schottky electrode 20, and a metal film 32 disposed on the side surface thereof.

In the above description, such examples are shown where the semiconductor device is the SBD; however, the present invention is applicable to a semiconductor device that has the Schottky junction and is different than the SBD. For example, the semiconductor device may be a semiconductor device including a diode with a junction barrier Schottky (JBS) structure, a semiconductor device including a diode with an MPS (Merged PIN Schottky) structure in which the Schottky junction and a pn junction are merged with each other by adding a pn junction region to the SBD, or the like.

Various modifications will become possible for those skilled in the art after receiving the teachings of the present disclosure without departing from the scope thereof.

What is claimed is:

1. A semiconductor device comprising:
    a semiconductor base body having a first main surface and a second main surface, the first main surface and the second main surface being opposite with each other;
    a Schottky electrode that is disposed on the first main surface and forms a Schottky junction with the semiconductor base body; and
    a barrier metal layer that is brought into ohmic contact with the first main surface around the Schottky electrode and covers a side surface of the Schottky electrode,
    wherein the barrier metal layer is continuously disposed from the side surface of the Schottky electrode to an upper surface of the Schottky electrode, further comprising
        a first main electrode disposed on an upper surface of the barrier metal layer,
    wherein the barrier metal layer is made of a material that suppresses diffusion of metal contained in the Schottky electrode and metal contained in the first main electrode,
    wherein the first main electrode is disposed in an inside of the barrier metal layer when viewed from above, and a ratio of an area of the first main electrode to an area of the barrier metal layer is 0.6 or more to less than 1.

2. The semiconductor device of claim 1, wherein
    the semiconductor base body includes a guard ring that forms a pn junction with a surrounding region of the semiconductor base body, the guard ring being disposed on a part of an upper portion of the semiconductor base body so as to surround a periphery of a contact surface on which the Schottky electrode is disposed of the first main surface, and
    the barrier metal layer is extended on the first main surface from a region in contact with the side surface of the Schottky electrode toward an outside, and an outer edge of the barrier metal layer does not go beyond an outer edge of the guard ring.

* * * * *